(12) United States Patent
Hayashi et al.

(10) Patent No.: US 9,741,596 B2
(45) Date of Patent: Aug. 22, 2017

(54) BONDING APPARATUS AND BONDING PROCESS METHOD

(71) Applicant: Shibaura Mechatronics Corporation, Yokohama-shi, Kanagawa-ken (JP)

(72) Inventors: Konosuke Hayashi, Kanagawa-ken (JP); Emi Matsui, Kanagawa-ken (JP)

(73) Assignee: SHIBAURA MECHATRONICS CORPORATION, Yokohama-Shi, Kanagawa-Ken (JP)

( * ) Notice: Subject to any disclaimer, the term of this patent is extended or adjusted under 35 U.S.C. 154(b) by 513 days.

(21) Appl. No.: 14/138,196

(22) Filed: Dec. 23, 2013

(65) Prior Publication Data

US 2014/0182761 A1    Jul. 3, 2014

(30) Foreign Application Priority Data

Dec. 28, 2012    (JP) .................. 2012-287536

(51) Int. Cl.

| B29C 65/48 | (2006.01) |
|---|---|
| B29C 65/78 | (2006.01) |
| B32B 37/10 | (2006.01) |
| B32B 38/18 | (2006.01) |
| B32B 39/00 | (2006.01) |
| B32B 43/00 | (2006.01) |
| C08J 5/12 | (2006.01) |
| B23K 37/04 | (2006.01) |
| H01L 21/673 | (2006.01) |

(Continued)

(52) U.S. Cl.
CPC ...... *H01L 21/673* (2013.01); *H01L 21/67092* (2013.01); *H01L 21/6838* (2013.01); *Y10T 156/10* (2015.01); *Y10T 156/17* (2015.01)

(58) Field of Classification Search
USPC ........ 156/60, 307.1, 307.3, 307.7, 378, 391, 156/497, 538, 580
See application file for complete search history.

(56) References Cited

U.S. PATENT DOCUMENTS

| 2005/0101103 A1 | 5/2005 | Yamamoto |
|---|---|---|
| 2007/0184195 A1 | 8/2007 | Hatakeyama |

(Continued)

FOREIGN PATENT DOCUMENTS

| CN | 101801646 A | 8/2010 | |
|---|---|---|---|
| DE | 19733215 A1 * | 2/1999 | ............... A21C 9/08 |

(Continued)

OTHER PUBLICATIONS

Machine Translation of WO 2009/060855 (May 30, 2016).*

(Continued)

*Primary Examiner* — Sing P Chan
(74) *Attorney, Agent, or Firm* — Pearne & Gordon LLP

(57) ABSTRACT

According to one embodiment, a bonding apparatus for processing a retained substrate includes a main body unit, a nozzle, a gas supply unit, and a substrate support unit. The nozzle opens on a face of the main body unit on a side that a first substrate is retained. The gas supply unit is configured to supply gas to the nozzle, to apply suction to the first substrate and to separate the substrate from the face of the main body unit. The substrate support unit is configured to support a peripheral edge portion of a second substrate provided in opposition to the first substrate with a predetermined gap.

12 Claims, 5 Drawing Sheets

(51) Int. Cl.
    *H01L 21/67*         (2006.01)
    *H01L 21/683*       (2006.01)

(56) References Cited

U.S. PATENT DOCUMENTS

| | | |
|---|---|---|
| 2009/0181553 A1 | 7/2009 | Koelmel |
| 2012/0255365 A1 | 10/2012 | Wimplinger |
| 2013/0292062 A1 | 11/2013 | Iwashita |

FOREIGN PATENT DOCUMENTS

| | | | | |
|---|---|---|---|---|
| EP | 0 999 575 A2 | 5/2000 | | |
| JP | 10-296624 A | 11/1998 | | |
| JP | WO 2009060855 A1 * | 5/2009 | ............ | B32B 37/10 |
| JP | 2012-156163 A | 8/2012 | | |
| KR | 10-2007-0079924 A | 8/2007 | | |
| KR | 10-2010-0057653 A | 5/2010 | | |
| KR | 10-2012-010990 A | 9/2012 | | |
| KR | 10-2012-0120122 A | 11/2012 | | |
| TW | 200939389 A | 9/2009 | | |
| TW | 201107138 A1 | 3/2011 | | |
| TW | 415406 U | 11/2011 | | |
| TW | 201246271 A1 | 11/2012 | | |

OTHER PUBLICATIONS

Machine Translation of DE 19733215 (May 30, 2016).*
English Abstract of DE 19733215 (May 30, 2016).*
Chinese Office action for 201310741286.4 dated Feb. 24, 2016.
Taiwanese Office action for 102148890 dated May 28, 2015.
Korean Office action for 10-2013-0160210 dated Dec. 17, 2014.
Japanese Office action for 2012-287536 dated Jan. 5, 2017.
Extended European Search Report for 13 19 9664 dated Mar. 3, 2017.

* cited by examiner

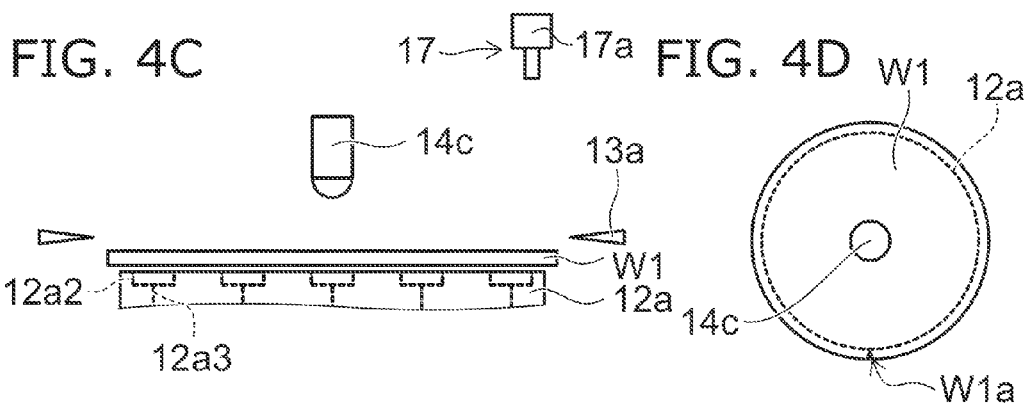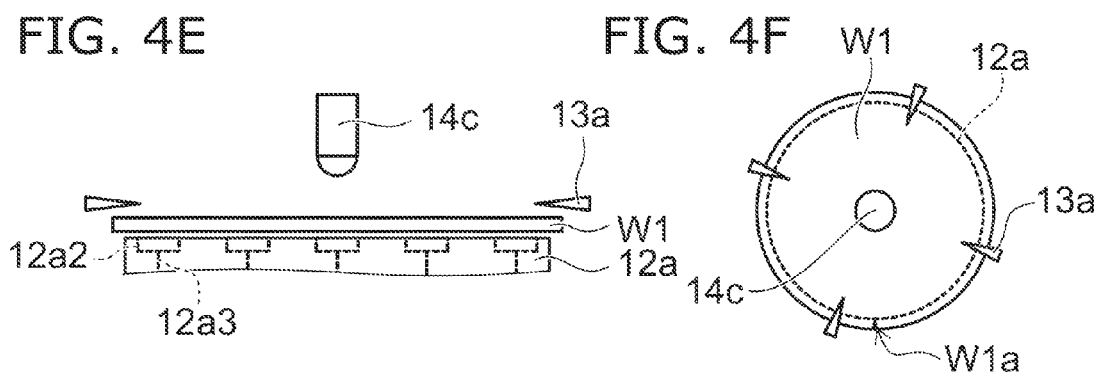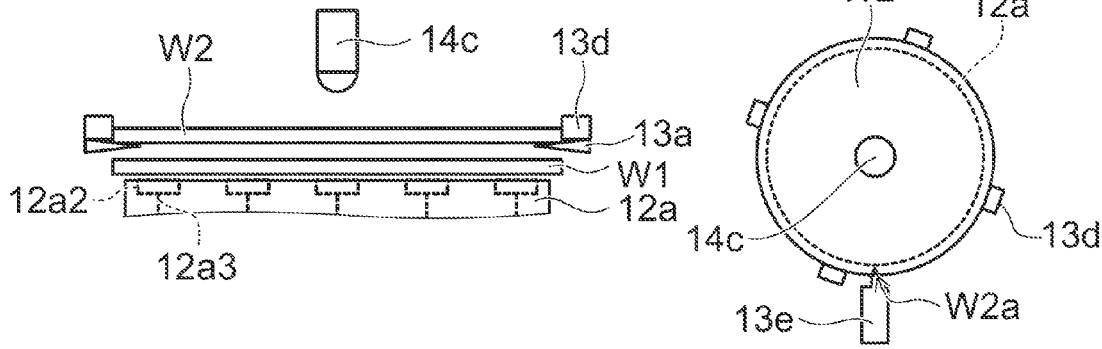

BONDING APPARATUS AND BONDING PROCESS METHOD

CROSS-REFERENCE TO RELATED APPLICATIONS

This application is based upon and claims the benefit of priority from Japanese Patent Application No. 2012-287536, filed on Dec. 28, 2012; the entire contents of which are incorporated herein by reference.

BACKGROUND

Field

Embodiments of the invention described herein relate to a bonding apparatus and a bonding process method.

Description of the Related Art

In bonding apparatus used for manufacturing electronic devices such as semiconductor devices and flat panel displays, substrates are attracted and retained using an electrostatic chuck or vacuum chuck provided on a mounting platform (for example, see Patent Document 1).

However, when a substrate is attracted to the mounting face of the mounting platform using an electrostatic chuck or vacuum chuck provided on the mounting platform, the substrate is attracted and retained so as to follow the mounting face.

Therefore, there is a possibility that the substrate will be deformed into a shape that is not suitable for processing. In particular, if the thickness of the substrate is small, such as silicon wafers and the like, the effect of the condition of the mounting face becomes significant.

Also, if the substrate is deformed into a shape that is not suitable for processing, for example, there is a possibility that in the substrate bonding process, the substrate will be bonded in a position deviated from the proper position.

Also, the substrate contacts the mounting face of the mounting platform, so there is a possibility of damage to the substrate and generation of particles.

CITATION LIST

Patent Literature

Patent Literature 1 JP 2012-156163 A (Kokai)

SUMMARY

According to one embodiment, a bonding apparatus for processing a retained substrate includes a main body unit, a nozzle, a gas supply unit, and a substrate support unit. The nozzle opens on a face of the main body unit on a side that a first substrate is retained. The gas supply unit is configured to supply gas to the nozzle, to apply suction to the first substrate and to separate the substrate from the face of the main body unit. The substrate support unit is configured to support a peripheral edge portion of a second substrate provided in opposition to the first substrate with a predetermined gap.

BRIEF DESCRIPTION OF THE DRAWINGS

FIGS. 4A to 4H are schematic process views for illustrating the action of the bonding apparatus 1.

DETAILED DESCRIPTION

Figure 1:
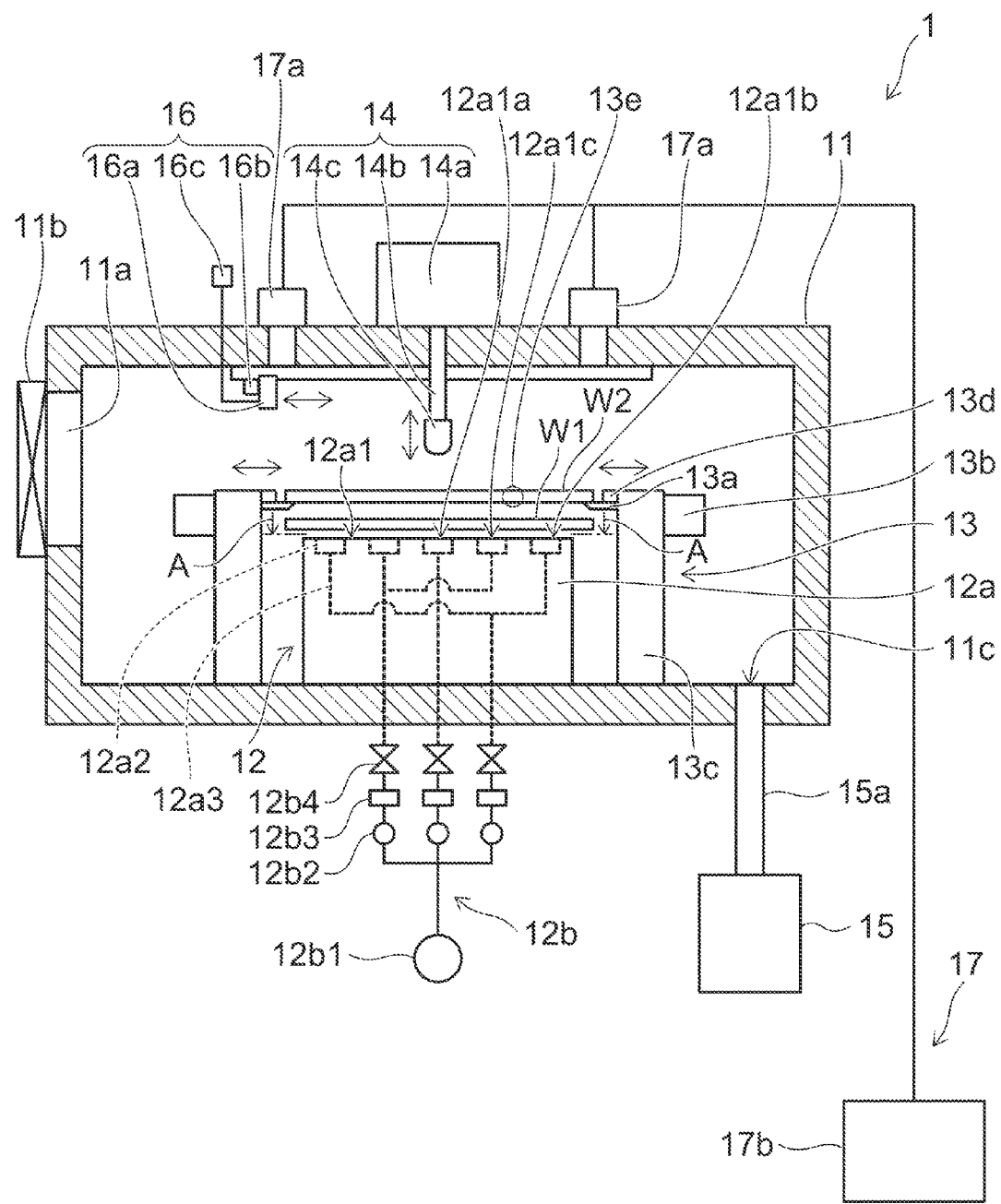
FIG. 1 is a schematic view for illustrating a bonding apparatus 1 according to the embodiment.

Embodiments will now be described with reference to the drawings. Note that the same numerals are applied to similar constituent elements in the drawings and detailed descriptions of such constituent elements are appropriately omitted.

FIG. 1 is a schematic view for illustrating a bonding apparatus 1 according to the embodiment.

FIG. 1 illustrates the bonding apparatus 1 that bonds the bonding faces of two substrates together to produce a single substrate.

The bonding apparatus 1 can directly bond two silicon wafers, for example.

As shown in FIG. 1, a processing container 11, a substrate retention unit 12, a substrate support unit 13, a pressing unit 14, a exhaust unit 15, a measurement unit 16, and a detection unit 17 are provided in the bonding apparatus 1.

The processing container 11 has an air-tight structure capable of maintaining an atmosphere at a pressure lower than atmospheric pressure. An opening 11a for transporting in and transporting out a substrate W1 (corresponding to one example of a first substrate) and a substrate W2 (corresponding to one example of a second substrate) and a door 11b capable of opening and closing the opening 11a in an air-tight manner are provided in a side wall of the processing container 11. Also, an opening 11c is provided in the bottom of the processing container 11 for evacuating the air within the processing container 11.

The substrate retention unit 12 that retains the first substrate W1 to be bonded is provided within the processing container 11.

The substrate retention unit 12 retains the substrate W1 in a suspended state.

A main body unit 12a and a gas supply unit 12b are provided in the substrate retention unit 12.

The main body unit 12a is cylindrical shaped and includes nozzles 12a2 that open on a face 12a1 on the side that the substrate W1 is retained.

Figure 2:
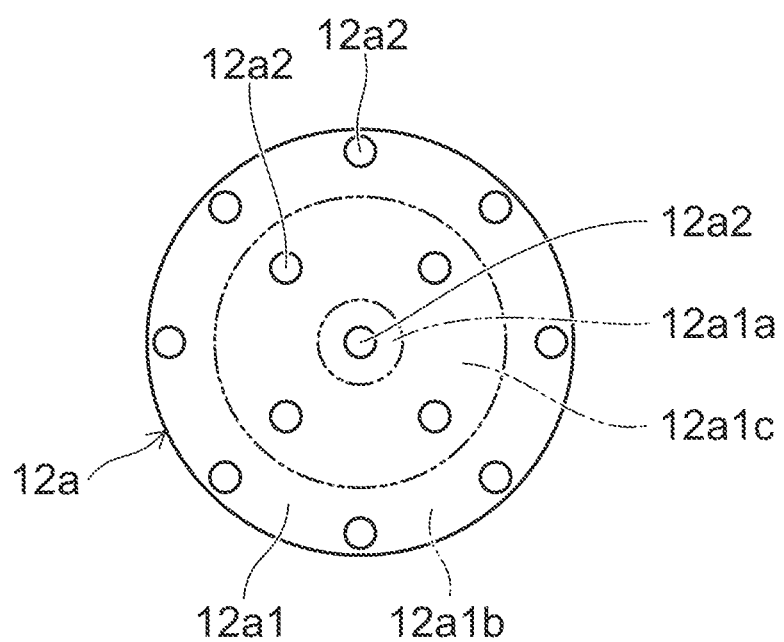
FIG. 2 is a schematic view for illustrating the layout of the nozzles 12a2.

FIG. 2 is a schematic view for illustrating the layout of the nozzles 12a2.

Furthermore, FIG. 2 is a drawing viewed from the arrow direction of the line A-A in FIG. 1.

As shown in FIG. 2, the nozzles 12a2 are provided in a region 12a1a of the face 12a1 in opposition to the central region of the substrate W1, a region 12a1b of the face 12a1 in opposition to the peripheral edge region of the substrate W1, and a region 12a1c of the face 12a1 in opposition to the region between the central region and the peripheral edge region of the substrate W1.

The layout and number of the nozzles 12a2 are not limited to that illustrated, but they may be changed as appropriate. For example, the nozzles 12a2 can be arranged concentrated in regions where the substrate W1 can easily warp or regions where it is necessary to deform the substrate W1.

Also, as shown in FIG. 1, a first end of a flow channel 12a3 is connected to the nozzles 12a2. A second end of the flow channel 12a3 is connected to an on-off valve 12b4.

Details of the action of the nozzle 12a2 are described later.

The gas supply unit 12b supplies gas to the nozzle 12a2, and applies suction to the substrate W1 by generating at least one of the cyclone effect and the Bernoulli effect, and separates the substrate W1 from the face 12a1 of the main body unit 12a. In other words, the substrate W1 is suspended and attracted to the face 12a1 of the main body unit 12a. If it is possible to separate the substrate W1 from the face 12a1 of the main body unit 12a, the substrate W1 is not affected by the condition of the face 12a1, so it is possible to retain the substrate W1 as well as keep the substrate W1 in a shape suitable for processing.

A gas supply source 12b1, a temperature control unit 12b2, a flow rate control unit 12b3, and the on-off valve 12b4 are provided in the gas supply unit 12b.

The gas supply source 12b1, the temperature control unit 12b2, the flow rate control unit 12b3, and the on-off valve 12b4 are provided for each set of nozzles 12a2 provided in the regions 12a1a to 12a1c. Therefore, it is possible to control the gas temperature, the gas flow rate, and the supply and stoppage of the gas in each of the regions 12a1a to 12a1c.

The gas supply source 12b1 can be, for example, a pressure vessel that contains high pressure gas, or the like. The gas contained in the gas supply source 12b1 is supplied to the nozzles 12a2 via the temperature control unit 12b2, the flow rate control unit 12b3, and the on-off valve 12b4, and released into the processing container 11 from the opening of the nozzles 12a2. Therefore, the gas contained in the gas supply source 12b1 has little effect on the processing (bonding of substrates) of the substrates. The gas contained in the gas supply source 12b1 can be, for example, nitrogen gas or an inert gas such as argon gas, helium gas, and the like.

The temperature control unit 12b2 is connected to the gas outflow side of the gas supply source 12b1. The temperature control unit 12b2 controls the temperature of the gas to be supplied to the inside of the nozzles 12a2 from the gas supply source 12b1. The temperature control unit 12b2 can be, for example, a heater or a cooler or a device that heats and cools, or the like.

If there is an in-plane temperature distribution of the substrate W1, there is a possibility of deformation of the substrate W1 (for example, warping).

If the substrate W1 is initially not deformed, the temperature of the gas for each of the regions 12a1a to 12a1c can be controlled so that the in-plane temperature of the substrate W1 is uniform, so that the substrate W1 is not deformed.

Also, the substrate W1 may be deformed initially. In this case, if the deformation of the substrate W1 is small, the temperature of the gas can be controlled for each of the regions 12a1a to 12a1c so that the in-plane temperature distribution of the substrate W1 is small. If the deformation of the substrate W1 is large, the temperature of the gas can be controlled in each of the regions 12a1a to 12a1c so that the deformation of the substrate W1 becomes smaller. In other words, if the substrate W1 is initially deformed, the in-plane temperature of the substrate W1 can be made uniform so that the substrate W1 does not further deform, or by locally heating or cooling, the deformed substrate W1 can be corrected.

The flow rate control unit 12b3 is connected to the gas outflow side of the temperature control unit 12b2. The flow rate control unit 12b3 controls the flow rate of the gas to be supplied to the inside of the nozzles 12a2 from the gas supply source 12b1. The flow rate control unit 12b3 can be a mass flow controller (MFC) or the like.

As described later, by controlling the flow rate of the gas to be supplied to the inside of the nozzles 12a2, it is possible to control the suction force applied to the substrate W1. For example, by increasing the flow rate of the gas to be supplied to the inside of the nozzles 12a2, it is possible to increase the suction force applied to the substrate W1. By reducing the flow rate of the gas to be supplied to the inside of the nozzles 12a2, it is possible to reduce the suction force applied to the substrate W1.

In this case, if the substrate W1 is not deformed, or if the deformation of the substrate W1 is small, the flow rate of the gas can be controlled so that the suction force in the regions 12a1a to 12a1c is uniform. If the deformation of the substrate W1 is large, the flow rate of the gas can be controlled in each of the regions 12a1a to 12a1c so that the deformation of the substrate W1 becomes smaller. In other words, it is possible to make the suction force applied to the substrate W1 uniform so that the substrate W1 does not deform, and it is possible to locally change the suction force applied to the substrate W1 to correct the substrate W1.

The state of deformation of the substrate W1 can be measured by the measurement unit 16 as described later.

In other words, the flow rate control unit 12b3 controls the gas flow rate in accordance with the shape of the substrate W1.

In this case, the flow rate control unit 12b3 can control the flow rate of the gas in at least one of each of the plurality of nozzles 12a2 and each of the groups of the plurality of nozzles 12a2.

In addition, it is possible to control the flow rate or the temperature of the gas to be supplied to the inside of the nozzles 12a2 to deform the substrate W1 into a shape suitable for processing. For example, it is possible to deform the substrate into a shape so that the central region of the substrate W1 projects upwards (substrate W2 side). By deforming the substrate W1 into this shape, the central region of the substrate W1 can easily contact the substrate W2, so bonding is easy.

The on-off valve 12b4 is connected to the gas outflow side of the flow rate control unit 12b3. The on-off valve 12b4 controls the supply and stoppage of the gas to be supplied to the inside of the nozzles 12a2 from the gas supply source 12b1.

The gas outflow side of the on-off valve 12b4 is connected to the nozzles 12a2 via the flow channel 12a3.

The substrate support unit 13 supports the peripheral edge portion of the substrate W2 provided in opposition to the substrate W1 supported by the substrate retention unit 12 with a predetermined gap. In other words, the substrate support unit 13 supports the peripheral edge portion of the substrate W2 to be bonded to the substrate W1.

The substrate support unit 13 includes a support claw 13a, a moving part 13b, a base part 13c, a positioning part 13d, and a positioning part 13e.

The support claw 13a supports the peripheral edge portion of the substrate W2. Then, by supporting the substrate W2 with the support claw 13a, the substrate W2 is supported in a predetermined position in opposition to the substrate W1 retained by the substrate retention unit 12.

The moving part 13b moves the support claw 13a between the position where the substrate W2 is supported and a position retracted to the outside in the radial direction of the substrate W2. The moving part 13b can include a control motor such as, for example, a servo motor, a pulse motor, or the like as a constituent element.

The base part 13c is provided on the bottom face of the processing container 11. The support claw 13a and the moving part 13b are provided on the upper end portion of the base part 13c. A case in which the base part 13c is provided for each of the support claw 13a and the moving part 13b is illustrated, but this is not a limitation. For example, a plurality of support claws 13a and moving parts 13b can be provided on a single base part 13c.

The positioning part 13d changes the relative position of the substrate W1 and the substrate W2 based on information regarding the positioning from the detection unit 17 to be described later. In this case, the positioning part 13d positions the substrate W2 within the horizontal plane. The positioning part 13d can position the substrate W2 relative to the substrate W1 retained by the substrate retention unit 12, for example. In this case, an example in which the substrate W2 supported by the support claw 13a is positioned by pushing the outer periphery of the substrate W2 in the horizontal direction is illustrated as the positioning part 13d. For example, the positioning part 13d can operate by a moving part not illustrated on the drawings that is configured from a control motor such as a servo motor, a pulse motor, or the like.

The positioning part 13e positions the substrate W2 in the rotational direction. For example, the positioning part 13e can position the substrate W2 in the rotational direction by inserting a pin in a notch provided in the periphery of the substrate W1. For example, the positioning part 13e can operate by a moving part not illustrated on the drawings that is provided in the base part 13c and configured from a control motor such as a servo motor, a pulse motor, or the like.

There is no particular limitation on the number of support claws 13a provided, but preferably the support claw 13a is provided at not less than three equidistant positions on the periphery of the substrate W2. In this way, the support state of the substrate W2 can be stabilized.

The pressing unit 14 bends the substrate W2 by pressing approximately the central portion of the substrate W2 supported by the support claw 13a using a pad 14c, to bring a portion of the bonding face of the substrate W1 into contact with a portion of the bonding face of the substrate W2.

A moving part 14a, a moving shaft 14b, and the pad 14c are provided in the pressing unit 14.

The pressing unit 14 is provided in opposition to the face 12a1 of the main body unit 12a. Also, the pressing unit 14 is provided in a position so that it can press approximately the central portion of the substrate W2 supported by the support claw 13a using the pad 14c.

The moving part 14a is provided on the outside of the processing container 11 in a position in opposition to the face 12a1 of the main body unit 12a. The moving part 14a can include a control motor such as a servo motor, a pulse motor, or the like as a constituent element. Also, it can include an element that is driven by pressure controlled fluid (for example, an air cylinder or the like) as a constituent element.

The moving shaft 14b is provided penetrating a wall face of the processing container 11 and a first end of the moving shaft 14b is connected to the moving part 14a. Also, the pad 14c is fitted to a second end of the moving shaft 14b.

The tip of the pad 14c has substantially a hemispherical shape, and the base of the pad 14c has a cylindrical shape. The pad 14c is formed from a soft elastic material, so that when pressed, the contact portion can deform from point contact to plane contact. Therefore, it is possible to relieve the stress at the pressing point (contact point), so it is possible to suppress damage to the substrate W2. Also, it is also possible to suppress the occurrence of voids, the occurrence of breakage and defects, the occurrence of rubbing damage, and the occurrence of positional deviation due to slips, and the like. The pad 14c can be formed from a soft resin such as, for example, silicon rubber, fluorine rubber, or the like. In this case, if the pad 14c is formed from silicon rubber or fluorine rubber, it is possible to suppress contamination of the substrate W2.

Also, a detection apparatus such as a load cell or the like can be provided in at least one of the moving part 14a, the moving shaft 14b, and the pad 14c, to detect the pressing force of the pad 14c, so it is possible to control the pressing force to a predetermined value.

Also, by controlling the pressing force of the pad 14c, it is possible to ensure that when bonding the substrate W1 and the substrate W2, the reverse side of the substrate W1 (the face on the side opposite the face to be bonded to the substrate W2) suspended and attracted to the face 12a1 of the main body unit 12a does not contact the face 12a1 of the main body unit 12a.

In other words, the pressing unit 14 presses the substrate W2 to bring a portion of the substrate W1 and a portion of the substrate W2 into contact, and it is possible to control the pressing force so that the reverse side of the substrate W1 does not contact the face 12a1 of the main body unit 12a.

By ensuring that the reverse side of the substrate W1 and the face 12a1 of the main body unit 12a do not contact, even if, for example, there is a particle on the face 12a1, it is possible to carry out the bonding while maintaining a clean state without the particle adhering to the reverse side of the substrate W1.

The exhaust unit 15 is connected to the opening 11c via a pipe 15a. The exhaust unit 15 evacuates the air within the processing container 11. The exhaust unit 15 can be, for example, a dry pump or the like.

In this case, gas is supplied to the inside of the processing container 11 by the gas supply unit 12b. Therefore, the quantity of air evacuated by the exhaust unit 15 is greater than the quantity of gas supplied by the gas supply unit 12b.

Bonding the substrate W1 and the substrate W2 is not necessarily carried out under a reduced pressure atmosphere, for example, it may also be carried out under an atmospheric pressure atmosphere. If bonding of the substrate W1 and the substrate W2 is not carried out under a reduced pressure atmosphere, it is not necessary to provide the exhaust unit 15, and, the processing container 11 needs only to have an air-tight structure sufficient to suppress the ingress of particles and the like.

It is possible to provide a support member not illustrated on the drawings to provide the pressing unit 14 in opposition to the face 12a1 of the main body unit 12a, without providing the processing container 11. The support member not illustrated on the drawings can be, for example, provided with an approximately inverted U-shape, that straddles the main body unit 12a and the substrate support unit 13.

However, if bonding of the substrate W1 and the substrate W2 is carried out under a reduced pressure atmosphere, it is possible to suppress air being trapped between the substrate W1 and the substrate W2, so it is possible to further suppress the occurrence of voids.

The measurement unit 16 measures the deformation state of the substrate W1.

A measurement head 16a, a moving part 16b, and a calculation unit 16c is provided in the measurement unit 16.

The measurement head 16a can convert the amount of deformation of the substrate W1 into an electrical signal. The measurement head 16a can be, for example, a laser deformation meter or the like.

The moving part 16b changes the relative positions of the measurement head 16a and the substrate W1. The moving part 16b can include a control motor such as, for example, a servo motor, a pulse motor, or the like as a constituent element.

The calculation unit 16c converts the electrical signal from the measurement head 16a into the amount of deformation of the substrate W1, to obtain the deformation state of the substrate W1.

The measurement unit 16 may be provided on the ceiling of the processing container 11, as illustrated in FIG. 1, but, for example, it may also be provided within the main body unit 12a, and by measuring the displacement of the reverse side of the substrate W1, the deformation state of the substrate W1 is measured.

The detection unit 17 detects the positions of the substrate W1 and the substrate W2 by detecting the peripheral edge portions of the substrate W1 and the substrate W2. In other words, the detection unit 17 detects the relative positions of the substrate W1 and the substrate W2 at the peripheral edge portion of the substrate W1 retained by the substrate retention unit 12 and the peripheral edge portion of the substrate W2 supported by the substrate support unit 13. Also, the detection unit 17 detects the positions of notches provided in the peripheral edge portions of the substrate W1 and the substrate W2.

A detection head 17a and a calculation unit 17b are provided in the detection unit 17.

The detection head 17a can be provided on the ceiling of the processing container 11, for example.

The detection head 17a can be, for example, a charge coupled device (CCD) image sensor or the like.

There is no particular limitation on the number of detection heads 17a provided, but if a plurality of detection heads 17a is provided at equal intervals around the main body unit 12a, it is possible to increase the accuracy of detection.

The calculation unit 17b is electrically connected to the detection head 17a. The calculation unit 17b calculates the relative positions of the substrate W1 and the substrate W2, based on the information from the detection head 17a, and produces information regarding positioning. The calculation unit 17b can be, for example, an image processing apparatus. The information regarding positioning is sent to the substrate support unit 13, and is used when positioning by changing the relative positions of the substrate W1 and the substrate W2. For example, in the case illustrated in FIG. 1, the information regarding positioning is used when positioning the substrate W2 relative to the substrate W1 retained by the substrate retention unit 12.

Next, the action of the nozzle 12a2 is further illustrated.

Figure 3A:
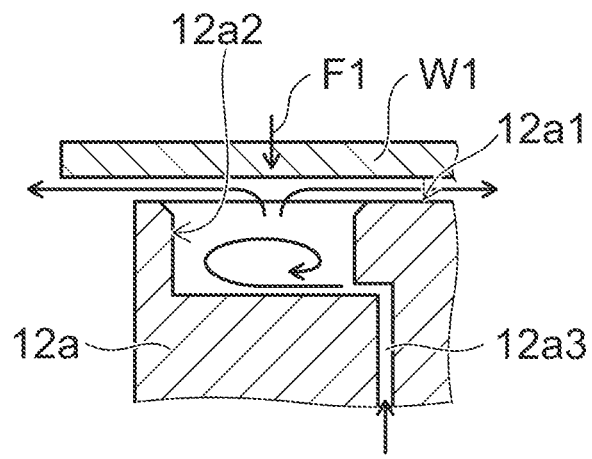
FIGS. 3A and 3B are schematic views for illustrating the action of the nozzle 12a2.
Figure 3B:
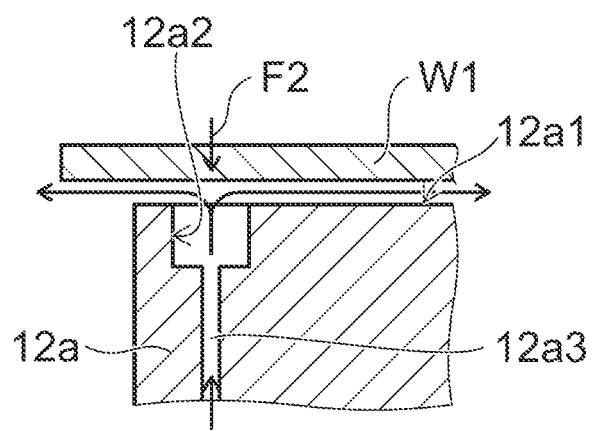

FIGS. 3A and 3B are schematic views for illustrating the action of the nozzle 12a2.

FIG. 3A shows a case in which the cyclone effect is used, and FIG. 3B shows a case in which the Bernoulli effect is used.

As shown in FIG. 3A, the flow channel 12a3 is connected to the side wall of the nozzle 12a2 which is a cylindrical shaped hole with a bottom. As a result of the gas supplied to the inside of the nozzle 12a2 from the flow channel 12a3, a flow of the gas is formed along the inner side wall of the nozzle 12a2, and a swirling flow is formed to the inside of the nozzle 12a2. Then, a suction force F1 applied to the substrate W1 is generated by the cyclone effect (the pressure difference between the central portion and the peripheral edge portion of the inside of the nozzle 12a2). On the other hand, the gas supplied from the flow channel 12a3 to the inside of the nozzle 12a2 flows out from the opening of the nozzle 12a2, and passes between the face 12a1 of the main body unit 12a and the substrate W1, and is released into the inside of the processing container 11. As a result, it is possible to retain the substrate W1 with the substrate W1 suspended from the face 12a1 of the main body unit 12a. In other words, it is possible to retain the substrate W1 without contact.

As shown in FIG. 3B, the flow channel 12a3 is connected to the bottom face of the nozzle 12a2 which is a cylindrical shaped hole with a bottom. The gas supplied from the flow channel 12a3 to the inside of the nozzle 12a2 flows out from the opening of the nozzle 12a2, and passes between the face 12a1 of the main body unit 12a and the substrate W1, and is released into the inside of the processing container 11. In this case, the dimension between the face 12a1 of the main body unit 12a and the substrate W1 is small, so the flow velocity of the gas flowing between the face 12a1 of the main body unit 12a and the substrate W1 is fast. Therefore, a suction force F2 applied to the substrate W1 is generated by the Bernoulli effect. As a result, it is possible to retain the substrate W1 with the substrate W1 suspended from the face 12a1 of the main body unit 12a. In other words, it is possible to retain the substrate W1 without contact.

Also, by controlling the flow rate of the gas to be supplied to the inside of the nozzle 12a2, it is possible to change the magnitude of the suction forces F1, F2 applied to the substrate W1. For example, by increasing the flow rate of the gas to be supplied to the inside of the nozzles 12a2, it is possible to increase the suction forces F1, F2 applied to the substrate W1. By reducing the flow rate of the gas to be supplied to the inside of the nozzles 12a2, it is possible to reduce the suction forces F1, F2 to be applied to the substrate W1. As a result, it is possible to make the suction forces F1, F2 applied to the substrate W1 uniform so that the substrate W1 does not deform, and it is possible to change the suction forces F1, F2 applied to the substrate W1 at each group of nozzles 12a2 provided in the regions 12a1a to 12a1c, for example, so that the deformed substrate W1 is corrected.

In addition, it is possible to control the flow rate of the gas to be supplied to the inside of the nozzles 12a2 to deform the substrate W1 into a shape suitable for processing. For example, it is possible to deform the substrate into a shape so that the central region of the substrate W1 projects upwards. By deforming the substrate W1 into this shape, the central region of the substrate W1 can easily contact the substrate W2, so bonding is easy.

Also, if the substrate W1 is deformed into a shape so that the central region of the substrate projects upwards, it is possible to bring the central region of the substrate W2 into contact with the substrate W1 without pressing with the pressing unit 14, by adjusting the distance to the substrate W2. In this case, it is not necessary to provide the pressing unit 14.

Also, a portion of the peripheral edge region of the substrate W1 may be projected upwards. In this case, the support claw 13a at a position in opposition to or near to the projecting portion of the substrate W1 can be moved (retracted) in the horizontal direction prior to the other support claws 13a so that the substrate W2 can be bonded to the substrate W1 using its self weight.

Examples have been described separately for the cyclone effect and the Bernoulli effect, but both the cyclone effect and the Bernoulli effect can be realized. Also, nozzles that realize the cyclone effect and nozzles that realize the Bernoulli effect can both be provided. Therefore, it is sufficient that at least one of the cyclone effect and the Bernoulli effect be realized.

However, there is no limitation on suspending and apply suction to the substrate W1 by realizing the cyclone effect or the Bernoulli effect, provided that it is possible to suspend and apply suction to the substrate W1.

Next, the action of the bonding apparatus 1 and the bonding process method are illustrated.

FIGS. 4A to 4H are schematic process views for illustrating the action of the bonding apparatus 1. FIGS. 4A, 4C, 4E, and 4G are side views, FIG. 4B is a plan view of FIG. 4A, FIG. 4D is a plan view of FIG. 4C, FIG. 4F is a plan view of FIG. 4E, and FIG. 4H is a plan view of FIG. 4G.

Figure 5A:
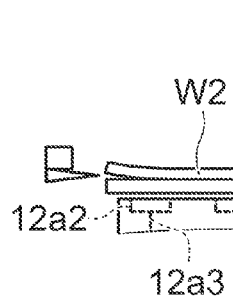
FIGS. 5A to 5D are also schematic process views for illustrating the action of the bonding apparatus 1.
Figure 5B:
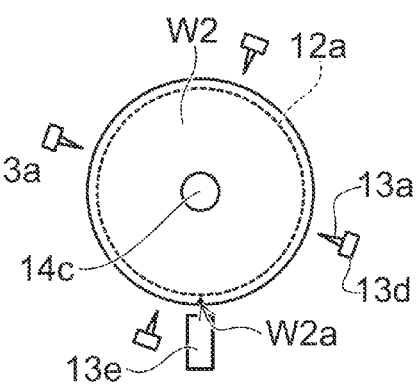

FIGS. 5A to 5D are also schematic process views for illustrating the action of the bonding apparatus 1. FIGS. 5A and 5B are schematic process views continuing from FIGS. 4G and 4H.

Figure 5C:
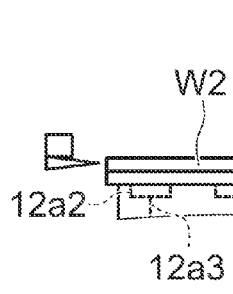
Figure 5D:
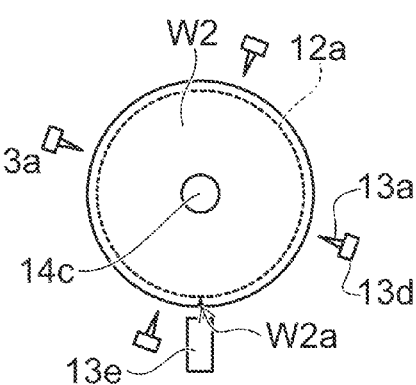

FIGS. 5A, 5C are side views, FIG. 5B is a plan view of FIG. 5A, and FIG. 5D is a plan view of FIG. 5C.

First, the substrate W1 is transported to the inside of the processing container 11 from the opening 11a by a transport apparatus not shown on the drawings. The door 11b is opened by a drive unit not illustrated on the drawings.

The substrate W1 transported to the inside of the processing container 11 is placed above the face 12a1 of the main body unit 12a.

Next, the substrate W1 is retained in a suspended state.

Gas is supplied from the gas supply unit 12b to the nozzles 12a2, and using at least one of the cyclone effect and the Bernoulli effect, the substrate W1 is retained in the suspended state.

Also, as shown in FIGS. 4A and 4B, the deformation state of the substrate W1 is measured by the measurement unit 16. For example, the deformation state of the substrate W1 is measured by measuring the displacements of the surface of the substrate W1 by moving the measurement head 16a by the moving part 16b.

Then, the flow rate or the temperature of the gas to be supplied to the inside of the nozzles 12a2 is controlled based on the measured deformation state of the substrate W1.

For example, by controlling the flow rate of the gas to be supplied to the inside of the nozzles 12a2, it is possible to make the suction force applied to the substrate W1 uniform so that the substrate W1 does not deform, and it is possible to change the suction force applied to the substrate W1 at each group of nozzles 12a2 provided in the regions 12a1a to 12a1c, to correct the deformed substrate W1. Also, it is possible to correct the deformed substrate W1 by changing the suction force of any one of the plurality of nozzles 12a2, not a group.

Also, by controlling the temperature of the gas to be supplied by the temperature control unit 12b2, the in-plane temperature of the substrate W1 can be made uniform so that the substrate W1 does not deform, or by locally heating or cooling the substrate W1, the deformed substrate W1 can be corrected.

In addition, it is possible to deform the substrate W1 into a shape suitable for processing. For example, it is possible to deform the substrate into a shape so that the central region of the substrate W1 projects upwards. By deforming the substrate W1 into this shape, the central region of the substrate W1 can easily contact the substrate W2, so bonding is easy.

In other words, the bonding process method according to the embodiment includes applying suction to the substrate W1 and separating the substrate W1 from the face 12a1 of the main body unit 12a by supplying gas to the nozzles 12a2 that open to the face 12a1 on the side of the main body unit 12a on which the substrate W1 is retained; and controlling the flow rate of the gas in accordance with the shape of the substrate W1.

Also, in the process of controlling the flow rate of the gas in accordance with the shape of the substrate W1, it is possible to control the flow rate of the gas in at least one of each of the plurality of nozzles 12a2 and each group of the plurality of nozzles 12a2 provided in the regions 12a1a to 12a1c.

Also, in the process of applying suction to the substrate W1 and separating the substrate W1 from the face 12a1 of the main body unit 12a, by supplying gas to the nozzles 12a2 that open on the face 12a1 on the side of the main body unit 12a on which the substrate W1 is retained, it is possible to realize at least one of the cyclone effect and the Bernoulli effect.

Also, at least one of the substrate W1 and the substrate W2 can be a silicon wafer.

Next, as shown in FIGS. 4C and 4D, the position of a notch W1a on the substrate W1 is detected by the detection unit 17.

Next, as shown in FIGS. 4E and 4F, the support claw 13a is moved to the position to support the substrate W2.

Next, the substrate W2 is transported to the inside of the processing container 11 from the opening 11a by a transport apparatus not illustrated on the drawings.

Then, as shown in FIGS. 4G and 4H, the substrate W2 is placed on the support claw 13a.

Next, the substrate W2 is positioned within the horizontal plane by the positioning part 13d.

Next, the position of a notch W2a provided on the peripheral edge of the substrate W2 is detected by the detection unit 17. At this time, the substrate W1 is moved in the horizontal direction to a position that will not obstruct detection of the position of the notch W2a of the substrate W2. After the position of the notch W2a has been detected, the substrate W1 is moved horizontally, to match the horizontal position of the substrate W2 (return to the position of FIG. 4G).

Next, the positioning part 13e aligns the substrate W2 with the position of the substrate W1 in the rotational direction. For example, by inserting a pin into the notch W1a provided in the peripheral edge of the substrate W1, the position in the rotational direction of the substrate W1 is aligned with the position in the rotational direction of the substrate W2.

Next, the substrate W1 and the substrate W2 are bonded.

First, the door 11b is closed and the processing container 11 is sealed. Then, the air is evacuated from the inside of the processing container 11.

If bonding is to be carried out in the atmosphere, it is not necessary to evacuate the air within the processing container 11.

Next, as shown in FIGS. 5A and 5B, the substrate W2 is bent by pressing with the pad 14c approximately the central portion of the substrate W2 supported by the support claw 13a, to bring a portion of the bonding face of the substrate W1 into contact with a portion of the bonding face of the substrate W2.

In this case, the support claw 13a is gradually moved in the retraction direction as the bonding progresses. When the support claw 13a is moved in the retraction direction, the portion supported by the support claw 13a moves to the peripheral edge portion side of the substrate W2, so the position in the height direction of the peripheral edge portion of the substrate W2 is lowered. Therefore, the portion in which the bonding face of the substrate W1 and the bonding face of the substrate W2 are in contact (the bonded portion) spreads from the central portion to the peripheral edge portion. Then, when the peripheral edge portion of the substrate W2 is released from the support claw 13a, the bonding face of the substrate W1 and the bonding face of the substrate W2 are in contact over the whole face. In other words, the substrate W is formed by bonding the substrate W1 and the substrate W2.

Also, as the bonding progresses, the positioning by the positioning parts 13d, 13e is released.

Also, when pressing approximately the central portion of the substrate W2 with the pad 14c, the pressing force of the pad 14c is controlled so that the reverse side of the substrate W1 (the face on the side opposite the bonding face with the substrate W2) suspended and attracted to the face 12a1 of the main body unit 12a does not contact the face 12a1 of the main body unit 12a.

Next, as shown in FIGS. 5C and 5D, the pad 14c is raised.

The bonded substrate W is transported to the outside of the processing container 11 by transport apparatus not illustrated on the drawings. Thereafter, if necessary, the procedure as described above can be repeated to continuously bond the substrate W1 and the substrate W2.

This completes the explanation of the embodiments. However, the invention is not limited to the above description.

In the above described embodiments, when constituent elements are appropriately added, removed or changed in design, processes are added or omitted, or conditions are modified by a person skilled in the art, provided that the resulting configuration includes the characteristics of the invention, it falls within the scope of the invention. For example, the shape, dimensions, material, arrangement, number, and the like of each of the elements included in the bonding apparatus 1 are not limited to those described above, but can be changed as appropriate. Also, in the embodiments as described above, an example of a bonding apparatus that directly bonds two silicon wafers was described, but the invention can also be applied to a bonding apparatus that bonds a silicon wafer to a support substrate via an adhesive layer, a bonding apparatus that bonds substrates other than silicon wafers (such as glass substrates, for example), and the like.

Components included in the embodiments described previously may be combined to the extent possible and such combinations are also encompassed within the scope of the invention as long as they include the features of the invention.

What is claimed is:

1. A bonding apparatus for bonding of a first substrate and a second substrate, comprising:
    a main body unit retaining a back surface of the first substrate being an opposite face from a bonding face;
    a nozzle opening on a face of the main body unit on a side that a first substrate is retained;
    a gas supply unit configured to supply gas to the nozzle, to apply suction to the back surface of the first substrate by at least one of cyclone effect and Bernoulli effect and to separate the back surface of the first substrate from the face of the main body unit;
    a substrate support unit configured to support a peripheral edge portion of the second substrate provided in opposition to the first substrate with a predetermined gap; and
    a pressing unit that presses one point of a back surface of the second substrate being an opposite face from a bonding face and brings a portion of the bonding face of the first substrate into contact with a portion of the bonding face of the second substrate, the pressing unit being provided to face an opening of the nozzle.

2. The bonding apparatus according to claim 1, wherein the gas supply unit includes a flow rate control unit configured to control the flow rate of the gas, and
    the flow rate control unit controls the flow rate of the gas in accordance with a shape of the first substrate.

3. The bonding apparatus according to claim 2, wherein the nozzle is provided in a plurality, and
    the flow rate control unit controls the flow rate of the gas in at least one of each of the plurality of nozzles and each group of the plurality of nozzles.

4. The bonding apparatus according to claim 1, wherein the gas supply unit generates at least one of cyclone effect and Bernoulli effect by supplying the gas to the nozzle.

5. The bonding apparatus according to claim 1, wherein at least one of the first substrate and the second substrate is a silicon wafer.

6. The bonding apparatus according to claim 1, further comprising a measurement unit that measures a deformation state of the first substrate.

7. The bonding apparatus according to claim 1, the pressing unit controls a pressing force so that the first substrate does not contact the face of the main body unit.

8. The bonding apparatus according to claim 1, the nozzles are provided with a plurality, some of the plurality of nozzles are provided in a region of the face in opposition to a central region of the first substrate, and some of the plurality of nozzles are provided a region of the face in opposition to a peripheral edge region of the first substrate.

9. A bonding process method for bonding a first substrate and a second substrate, comprising:
    applying suction to a back surface of the first substrate being an opposite face from a bonding face and separating the back surface of the first substrate from a face of a main body unit by supplying gas to a nozzle opening on the face of the main body unit on the side that the first substrate is retained; and
    bonding the first substrate and the second substrate provided in opposition to the first substrate, presses one point of a back surface of the second substrate being an opposite face from a bonding face, brings a portion of the bonding face of the first substrate into contact with a portion of the bonding face of the second substrate, the one point of the back surface of the second substrate facing an opening of the nozzle.

10. The bonding process method according to claim 9, further comprising controlling a flow rate of the gas in accordance with a shape of the first substrate, wherein the nozzle is provided in a plurality, and
    in the controlling the flow rate of the gas in accordance with the shape of the first substrate,
    the flow rate of the gas is controlled in at least one of each of the plurality of nozzles and each group of the plurality of nozzles.

11. The bonding process method according to claim 9, wherein in the applying suction to the first substrate and separating the first substrate from the face of the main body unit,
    at least one of cyclone effect and Bernoulli effect is generated by supplying the gas to the nozzle opening on the face of the main body unit on the side that the first substrate is retained.

12. The bonding process method according to claim 9, wherein at least one of the first substrate and the second substrate is a silicon wafer.

\* \* \* \* \*